(12) United States Patent
Brosh

(10) Patent No.: US 9,493,342 B2
(45) Date of Patent: Nov. 15, 2016

(54) WAFER LEVEL MEMS FORCE DIES

(71) Applicant: NextInput, Inc., Atlanta, GA (US)

(72) Inventor: Amnon Brosh, Santa Monica, CA (US)

(73) Assignee: NextInput, Inc., San Jose, CA (US)

( * ) Notice: Subject to any disclaimer, the term of this patent is extended or adjusted under 35 U.S.C. 154(b) by 144 days.

(21) Appl. No.: 13/924,047

(22) Filed: Jun. 21, 2013

(65) Prior Publication Data

US 2013/0341742 A1 Dec. 26, 2013

Related U.S. Application Data

(60) Provisional application No. 61/690,161, filed on Jun. 21, 2012.

(51) Int. Cl.
| | | |
|---|---|---|
| *H01L 21/306* | (2006.01) | |
| *B81B 3/00* | (2006.01) | |
| *B81C 1/00* | (2006.01) | |
| *G01L 1/04* | (2006.01) | |
| *G01L 1/18* | (2006.01) | |

(Continued)

(52) U.S. Cl.
CPC .......... *B81B 3/0072* (2013.01); *B81B 3/0021* (2013.01); *B81C 1/00158* (2013.01); *B81C 1/00666* (2013.01); *G01L 1/044* (2013.01); *G01L 1/18* (2013.01); *G01L 5/0028* (2013.01); *G01L 5/0057* (2013.01); *G01L 5/162* (2013.01)

(58) Field of Classification Search
CPC .................................................. H01L 21/306
USPC ........................................................ 257/417
See application file for complete search history.

(56) References Cited

U.S. PATENT DOCUMENTS

| | | |
|---|---|---|
| 4,814,856 A | 3/1989 | Kurtz et al. |
| 4,914,624 A | 4/1990 | Dunthorn |

(Continued)

FOREIGN PATENT DOCUMENTS

| | | |
|---|---|---|
| DE | 102010012441 | 9/2011 |
| JP | 2004156937 | 6/2004 |

(Continued)

OTHER PUBLICATIONS

Nesterov et al., Modelling and investigation of the silicon twin design 3D micro probe, 2005, Institute of Physics Publishing, Journal of Micromechanics and Microengineering, 15, 514-520.*

(Continued)

*Primary Examiner* — Kenneth Parker
*Assistant Examiner* — Christopher Culbert
(74) *Attorney, Agent, or Firm* — Meunier Carlin & Curfman LLC

(57) ABSTRACT

A composite wafer level MEMS force dies including a spacer coupled to a sensor is described herein. The sensor includes at least one flexible sensing element, such as a beam or diaphragm, which have one or more sensor elements formed thereon. Bonding pads connected to the sensor elements are placed on the outer periphery of the sensor. The spacer, which protects the flexible sensing element and the wire bonding pads, is bonded to the sensor. For the beam version, the bond is implemented at the outer edges of the die. For the diaphragm version, the bond is implemented in the center of the die. An interior gap between the spacer and the sensor allows the flexible sensing element to deflect. The gap can also be used to limit the amount of deflection of the flexible sensing element in order to provide overload protection.

20 Claims, 7 Drawing Sheets

(51) Int. Cl.
*G01L 5/00* (2006.01)
*G01L 5/16* (2006.01)

(56) References Cited

U.S. PATENT DOCUMENTS

| | | | |
|---|---|---|---|
| 4,918,262 A | 4/1990 | Flowers et al. | |
| 4,933,660 A | 6/1990 | Wynne | |
| 4,983,786 A | 1/1991 | Stevens | |
| 5,159,159 A | 10/1992 | Asher | |
| 5,237,879 A | 8/1993 | Speeter | |
| 5,320,705 A | 6/1994 | Fujii et al. | |
| 5,333,505 A | 8/1994 | Takahashi et al. | |
| 5,343,220 A | 8/1994 | Veasy et al. | |
| 5,349,746 A | 9/1994 | Gruenwald et al. | |
| 5,351,550 A | 10/1994 | Maurer | |
| 5,483,994 A | 1/1996 | Maurer | |
| 5,510,812 A | 4/1996 | O'Mara et al. | |
| 5,541,372 A | 7/1996 | Baller et al. | |
| 5,543,591 A | 8/1996 | Gillespie et al. | |
| 5,565,657 A | 10/1996 | Merz | |
| 5,600,074 A * | 2/1997 | Marek et al. | 73/862.625 |
| 5,673,066 A | 9/1997 | Toda et al. | |
| 5,889,236 A | 3/1999 | Gillespie et al. | |
| 5,921,896 A | 7/1999 | Boland | |
| 6,028,271 A | 2/2000 | Gillespie et al. | |
| 6,159,166 A | 12/2000 | Chesney et al. | |
| 6,243,075 B1 | 6/2001 | Fishkin et al. | |
| 6,348,663 B1 | 2/2002 | Schoos et al. | |
| 6,351,205 B1 | 2/2002 | Armstrong | |
| 6,360,598 B1 | 3/2002 | Calame et al. | |
| 6,437,682 B1 | 8/2002 | Vance | |
| 6,555,235 B1 | 4/2003 | Aufderheide et al. | |
| 6,556,189 B1 | 4/2003 | Takahata et al. | |
| 6,569,108 B2 | 5/2003 | Sarvazyan et al. | |
| 6,610,936 B2 | 8/2003 | Gillespie et al. | |
| 6,620,115 B2 | 9/2003 | Sarvazyan et al. | |
| 6,629,343 B1 | 10/2003 | Chesney et al. | |
| 6,668,230 B2 | 12/2003 | Mansky et al. | |
| 6,720,712 B2 | 4/2004 | Scott et al. | |
| 6,788,297 B2 | 9/2004 | Itoh et al. | |
| 6,801,191 B2 | 10/2004 | Mukai et al. | |
| 6,809,280 B2 | 10/2004 | Divigalpitiya et al. | |
| 6,812,621 B2 | 11/2004 | Scott | |
| 6,822,640 B2 | 11/2004 | Derocher | |
| 6,879,318 B1 | 4/2005 | Chan et al. | |
| 6,888,537 B2 | 5/2005 | Benson et al. | |
| 6,931,938 B2 | 8/2005 | Knirck et al. | |
| 6,995,752 B2 | 2/2006 | Lu | |
| 7,138,984 B1 | 11/2006 | Miles | |
| 7,173,607 B2 | 2/2007 | Matsumoto et al. | |
| 7,190,350 B2 | 3/2007 | Roberts | |
| 7,215,329 B2 | 5/2007 | Yoshikawa et al. | |
| 7,218,313 B2 | 5/2007 | Marcus et al. | |
| 7,224,257 B2 | 5/2007 | Morikawa | |
| 7,245,293 B2 | 7/2007 | Hoshino et al. | |
| 7,273,979 B2 | 9/2007 | Christensen | |
| 7,280,097 B2 | 10/2007 | Chen et al. | |
| 7,324,094 B2 | 1/2008 | Moilanen et al. | |
| 7,324,095 B2 | 1/2008 | Sharma | |
| 7,336,260 B2 | 2/2008 | Martin et al. | |
| 7,337,085 B2 | 2/2008 | Soss | |
| 7,345,680 B2 | 3/2008 | David | |
| 7,406,661 B2 | 7/2008 | Väänänen et al. | |
| 7,425,749 B2 | 9/2008 | Hartzell et al. | |
| 7,426,873 B1 | 9/2008 | Kholwadwala et al. | |
| 7,449,758 B2 | 11/2008 | Axelrod et al. | |
| 7,460,109 B2 | 12/2008 | Safai et al. | |
| 7,476,952 B2 | 1/2009 | Vaganov et al. | |
| 7,508,040 B2 | 3/2009 | Nikkel et al. | |
| 7,554,167 B2 | 6/2009 | Vaganov | |
| 7,607,111 B2 | 10/2009 | Vaananen et al. | |
| 7,620,521 B2 | 11/2009 | Breed et al. | |
| 7,629,969 B2 | 12/2009 | Kent | |
| 7,649,522 B2 | 1/2010 | Chen et al. | |
| 7,663,612 B2 | 2/2010 | Bladt | |
| 7,685,538 B2 | 3/2010 | Fleck et al. | |
| 7,698,084 B2 | 4/2010 | Soss | |
| 7,701,445 B2 | 4/2010 | Inokawa et al. | |
| 7,746,327 B2 | 6/2010 | Miyakoshi | |
| 7,791,151 B2 | 9/2010 | Vaganov et al. | |
| 7,819,998 B2 | 10/2010 | David | |
| 7,825,911 B2 | 11/2010 | Sano et al. | |
| 7,903,090 B2 | 3/2011 | Soss et al. | |
| 7,921,725 B2 | 4/2011 | Silverbrook et al. | |
| 7,952,566 B2 | 5/2011 | Poupyrev et al. | |
| 7,973,772 B2 | 7/2011 | Gettemy et al. | |
| 7,973,778 B2 | 7/2011 | Chen | |
| 8,004,052 B2 | 8/2011 | Vaganov | |
| 8,004,501 B2 | 8/2011 | Harrison | |
| 8,013,843 B2 | 9/2011 | Pryor | |
| 8,026,906 B2 | 9/2011 | Mölne et al. | |
| 8,044,929 B2 | 10/2011 | Baldo et al. | |
| 8,068,100 B2 | 11/2011 | Pryor | |
| 8,072,437 B2 | 12/2011 | Miller et al. | |
| 8,072,440 B2 | 12/2011 | Pryor | |
| 8,113,065 B2 | 2/2012 | Ohsato et al. | |
| 8,120,586 B2 | 2/2012 | Hsu et al. | |
| 8,120,588 B2 | 2/2012 | Klinghult | |
| 8,130,207 B2 | 3/2012 | Nurmi et al. | |
| 8,134,535 B2 | 3/2012 | Choi et al. | |
| 8,139,038 B2 | 3/2012 | Chueh et al. | |
| 8,144,133 B2 | 3/2012 | Wang et al. | |
| 8,149,211 B2 | 4/2012 | Hayakawa et al. | |
| 8,154,528 B2 | 4/2012 | Chen et al. | |
| 8,159,473 B2 | 4/2012 | Cheng et al. | |
| 8,164,573 B2 | 4/2012 | DaCosta et al. | |
| 8,183,077 B2 | 5/2012 | Vaganov et al. | |
| 8,184,093 B2 | 5/2012 | Tsuiki | |
| 8,188,985 B2 | 5/2012 | Hillis et al. | |
| 8,199,116 B2 | 6/2012 | Jeon et al. | |
| 8,212,790 B2 | 7/2012 | Rimas-Ribikauskas et al. | |
| 8,237,537 B2 | 8/2012 | Kurtz et al. | |
| 8,243,035 B2 | 8/2012 | Abe et al. | |
| 8,253,699 B2 | 8/2012 | Son | |
| 8,260,337 B2 | 9/2012 | Periyalwar et al. | |
| 8,269,731 B2 | 9/2012 | Mölne | |
| 8,289,288 B2 | 10/2012 | Whytock et al. | |
| 8,289,290 B2 | 10/2012 | Klinghult | |
| 8,319,739 B2 | 11/2012 | Chu et al. | |
| 8,325,143 B2 | 12/2012 | Destura et al. | |
| 8,350,345 B2 | 1/2013 | Vaganov | |
| 8,363,020 B2 | 1/2013 | Li et al. | |
| 8,363,022 B2 | 1/2013 | Tho et al. | |
| 8,378,798 B2 | 2/2013 | Bells et al. | |
| 8,378,991 B2 | 2/2013 | Jeon et al. | |
| 8,384,677 B2 | 2/2013 | Mak-Fan et al. | |
| 8,387,464 B2 | 3/2013 | McNeil et al. | |
| 8,405,631 B2 | 3/2013 | Chu et al. | |
| 8,405,632 B2 | 3/2013 | Chu et al. | |
| 8,421,609 B2 | 4/2013 | Kim et al. | |
| 8,427,441 B2 | 4/2013 | Paleczny et al. | |
| 8,436,806 B2 | 5/2013 | Almalki et al. | |
| 8,436,827 B1 | 5/2013 | Zhai et al. | |
| 8,451,245 B2 | 5/2013 | Heubel et al. | |
| 8,456,440 B2 | 6/2013 | Abe et al. | |
| 8,466,889 B2 | 6/2013 | Tong et al. | |
| 8,477,115 B2 | 7/2013 | Rekimoto | |
| 8,493,189 B2 | 7/2013 | Suzuki | |
| 2003/0067448 A1 | 4/2003 | Park | |
| 2003/0189552 A1 | 10/2003 | Chuang et al. | |
| 2004/0012572 A1 | 1/2004 | Sowden et al. | |
| 2004/0140966 A1 | 7/2004 | Marggraff et al. | |
| 2006/0028441 A1 | 2/2006 | Armstrong | |
| 2006/0244733 A1 | 11/2006 | Geaghan | |
| 2006/0284856 A1 | 12/2006 | Soss | |
| 2007/0035525 A1 | 2/2007 | Yeh et al. | |
| 2007/0046649 A1 | 3/2007 | Reiner | |
| 2007/0070046 A1 | 3/2007 | Sheynblat et al. | |
| 2007/0070053 A1 | 3/2007 | Lapstun et al. | |
| 2007/0097095 A1 | 5/2007 | Kim et al. | |
| 2007/0103449 A1* | 5/2007 | Laitinen | G06F 3/016 345/173 |
| 2007/0103452 A1 | 5/2007 | Wakai et al. | |
| 2007/0115265 A1 | 5/2007 | Rainisto | |

(56) References Cited

U.S. PATENT DOCUMENTS

| | | |
|---|---|---|
| 2007/0132717 A1 | 6/2007 | Wang et al. |
| 2007/0137901 A1 | 6/2007 | Chen |
| 2007/0139391 A1 | 6/2007 | Bischoff |
| 2007/0152959 A1 | 7/2007 | Peters |
| 2007/0156723 A1 | 7/2007 | Vaananen |
| 2007/0182864 A1 | 8/2007 | Stoneham et al. |
| 2007/0229478 A1 | 10/2007 | Rosenberg et al. |
| 2007/0235231 A1 | 10/2007 | Loomis et al. |
| 2007/0262965 A1 | 11/2007 | Hirai et al. |
| 2007/0277616 A1 | 12/2007 | Nikkel et al. |
| 2007/0298883 A1 | 12/2007 | Feldman et al. |
| 2008/0001923 A1 | 1/2008 | Hall et al. |
| 2008/0007532 A1 | 1/2008 | Chen |
| 2008/0010616 A1 | 1/2008 | Algreatly |
| 2008/0024454 A1 | 1/2008 | Everest |
| 2008/0030482 A1 | 2/2008 | Elwell et al. |
| 2008/0036743 A1 | 2/2008 | Westerman et al. |
| 2008/0088600 A1 | 4/2008 | Prest et al. |
| 2008/0094367 A1 | 4/2008 | Van De Ven et al. |
| 2008/0105470 A1 | 5/2008 | Van De Ven et al. |
| 2008/0106523 A1 | 5/2008 | Conrad |
| 2008/0174852 A1 | 7/2008 | Hirai et al. |
| 2008/0180402 A1 | 7/2008 | Yoo et al. |
| 2008/0180405 A1 | 7/2008 | Han et al. |
| 2008/0180406 A1 | 7/2008 | Han et al. |
| 2008/0202249 A1 | 8/2008 | Yokura et al. |
| 2008/0204427 A1 | 8/2008 | Heesemans et al. |
| 2008/0211766 A1 | 9/2008 | Westerman et al. |
| 2008/0238446 A1 | 10/2008 | DeNatale et al. |
| 2008/0238884 A1 | 10/2008 | Harish |
| 2008/0259046 A1 | 10/2008 | Carsanaro |
| 2008/0284742 A1 | 11/2008 | Prest et al. |
| 2008/0303799 A1 | 12/2008 | Schwesig et al. |
| 2009/0027352 A1 | 1/2009 | Abele |
| 2009/0027353 A1 | 1/2009 | Im et al. |
| 2009/0046110 A1 | 2/2009 | Sadler et al. |
| 2009/0102805 A1 | 4/2009 | Meijer et al. |
| 2009/0140985 A1 | 6/2009 | Liu |
| 2009/0184921 A1 | 7/2009 | Scott et al. |
| 2009/0184936 A1 | 7/2009 | Algreatly |
| 2009/0213066 A1 | 8/2009 | Hardacker et al. |
| 2009/0237374 A1 | 9/2009 | Li et al. |
| 2009/0242282 A1 | 10/2009 | Kim et al. |
| 2009/0243817 A1 | 10/2009 | Son |
| 2009/0243998 A1 | 10/2009 | Wang |
| 2009/0256807 A1 | 10/2009 | Nurmi |
| 2009/0256817 A1 | 10/2009 | Perlin et al. |
| 2009/0282930 A1 | 11/2009 | Cheng et al. |
| 2009/0303400 A1 | 12/2009 | Hou et al. |
| 2009/0309852 A1 | 12/2009 | Lin et al. |
| 2009/0314551 A1 | 12/2009 | Nakajima |
| 2010/0013785 A1 | 1/2010 | Murai et al. |
| 2010/0020030 A1 | 1/2010 | Kim et al. |
| 2010/0020039 A1 | 1/2010 | Ricks et al. |
| 2010/0039396 A1 | 2/2010 | Ho et al. |
| 2010/0053087 A1 | 3/2010 | Dai et al. |
| 2010/0053116 A1 | 3/2010 | Daverman et al. |
| 2010/0066686 A1 | 3/2010 | Joguet et al. |
| 2010/0066697 A1 | 3/2010 | Jacomet et al. |
| 2010/0079391 A1 | 4/2010 | Joung |
| 2010/0079395 A1 | 4/2010 | Kim et al. |
| 2010/0079398 A1 | 4/2010 | Shen et al. |
| 2010/0097347 A1 | 4/2010 | Lin |
| 2010/0117978 A1 | 5/2010 | Shirado |
| 2010/0123671 A1 | 5/2010 | Lee |
| 2010/0123686 A1 | 5/2010 | Klinghult et al. |
| 2010/0127140 A1 | 5/2010 | Smith |
| 2010/0128002 A1 | 5/2010 | Stacy et al. |
| 2010/0153891 A1 | 6/2010 | Vaananen et al. |
| 2010/0164959 A1 | 7/2010 | Brown et al. |
| 2010/0220065 A1 | 9/2010 | Ma |
| 2010/0271325 A1 | 10/2010 | Conte et al. |
| 2010/0289807 A1 | 11/2010 | Yu et al. |
| 2010/0295807 A1 | 11/2010 | Xie et al. |
| 2010/0308844 A1 | 12/2010 | Day et al. |
| 2010/0309714 A1 | 12/2010 | Meade |
| 2010/0315373 A1 | 12/2010 | Steinhauser et al. |
| 2010/0321310 A1 | 12/2010 | Kim et al. |
| 2010/0321319 A1 | 12/2010 | Hefti et al. |
| 2010/0323467 A1* | 12/2010 | Vaganov et al. .......... 438/53 |
| 2010/0328229 A1 | 12/2010 | Weber et al. |
| 2010/0328230 A1 | 12/2010 | Faubert et al. |
| 2011/0001723 A1 | 1/2011 | Fan |
| 2011/0006980 A1 | 1/2011 | Taniguchi et al. |
| 2011/0007008 A1 | 1/2011 | Algreatly |
| 2011/0012848 A1 | 1/2011 | Li et al. |
| 2011/0018820 A1 | 1/2011 | Huitema et al. |
| 2011/0032211 A1 | 2/2011 | Christoffersen |
| 2011/0039602 A1 | 2/2011 | McNamara et al. |
| 2011/0050628 A1 | 3/2011 | Homma et al. |
| 2011/0050630 A1 | 3/2011 | Ikeda |
| 2011/0057899 A1 | 3/2011 | Sleeman et al. |
| 2011/0063248 A1 | 3/2011 | Yoon |
| 2011/0128250 A1 | 6/2011 | Murphy et al. |
| 2011/0141052 A1 | 6/2011 | Bernstein et al. |
| 2011/0141053 A1 | 6/2011 | Bulea et al. |
| 2011/0187674 A1 | 8/2011 | Baker et al. |
| 2011/0209555 A1 | 9/2011 | Ahles et al. |
| 2011/0227836 A1 | 9/2011 | Li et al. |
| 2011/0242014 A1 | 10/2011 | Tsai et al. |
| 2011/0267181 A1 | 11/2011 | Kildal |
| 2011/0267294 A1 | 11/2011 | Kildal |
| 2011/0273396 A1 | 11/2011 | Chung |
| 2011/0291951 A1 | 12/2011 | Tong |
| 2011/0298705 A1 | 12/2011 | Vaganov |
| 2012/0032907 A1 | 2/2012 | Koizumi et al. |
| 2012/0032915 A1 | 2/2012 | Wittorf |
| 2012/0038579 A1 | 2/2012 | Sasaki |
| 2012/0044169 A1 | 2/2012 | Enami |
| 2012/0044172 A1 | 2/2012 | Ohki et al. |
| 2012/0050159 A1 | 3/2012 | Yu et al. |
| 2012/0050208 A1 | 3/2012 | Dietz |
| 2012/0056837 A1 | 3/2012 | Park et al. |
| 2012/0062603 A1 | 3/2012 | Mizunuma et al. |
| 2012/0068946 A1 | 3/2012 | Tang et al. |
| 2012/0068969 A1 | 3/2012 | Bogana et al. |
| 2012/0081327 A1 | 4/2012 | Heubel et al. |
| 2012/0086659 A1 | 4/2012 | Perlin et al. |
| 2012/0092250 A1 | 4/2012 | Hadas et al. |
| 2012/0092279 A1 | 4/2012 | Martin |
| 2012/0092294 A1 | 4/2012 | Ganapathi et al. |
| 2012/0092299 A1 | 4/2012 | Harada et al. |
| 2012/0092324 A1 | 4/2012 | Buchan et al. |
| 2012/0105358 A1 | 5/2012 | Momeyer et al. |
| 2012/0105367 A1 | 5/2012 | Son et al. |
| 2012/0113061 A1 | 5/2012 | Ikeda |
| 2012/0127088 A1 | 5/2012 | Pance et al. |
| 2012/0127107 A1 | 5/2012 | Miyashita et al. |
| 2012/0139864 A1 | 6/2012 | Sleeman et al. |
| 2012/0144921 A1 | 6/2012 | Bradley et al. |
| 2012/0146945 A1 | 6/2012 | Miyazawa et al. |
| 2012/0146946 A1 | 6/2012 | Wang et al. |
| 2012/0147052 A1 | 6/2012 | Homma et al. |
| 2012/0154315 A1 | 6/2012 | Aono |
| 2012/0154316 A1 | 6/2012 | Kono |
| 2012/0154317 A1 | 6/2012 | Aono |
| 2012/0154318 A1 | 6/2012 | Aono |
| 2012/0154328 A1 | 6/2012 | Kono |
| 2012/0154329 A1 | 6/2012 | Shinozaki |
| 2012/0154330 A1 | 6/2012 | Shimizu |
| 2012/0162122 A1 | 6/2012 | Geaghan |
| 2012/0169609 A1 | 7/2012 | Britton |
| 2012/0169617 A1 | 7/2012 | Määnpää |
| 2012/0169635 A1 | 7/2012 | Liu |
| 2012/0169636 A1 | 7/2012 | Liu |
| 2012/0188181 A1 | 7/2012 | Ha et al. |
| 2012/0194460 A1 | 8/2012 | Kuwabara et al. |
| 2012/0194466 A1 | 8/2012 | Posamentier |
| 2012/0200526 A1 | 8/2012 | Lackey |
| 2012/0204653 A1 | 8/2012 | August et al. |
| 2012/0205165 A1 | 8/2012 | Strittmatter et al. |
| 2012/0218212 A1 | 8/2012 | Yu et al. |
| 2012/0319987 A1 | 12/2012 | Woo |
| 2012/0327025 A1 | 12/2012 | Huska et al. |

(56) References Cited

U.S. PATENT DOCUMENTS

| | | |
|---|---|---|
| 2013/0038541 A1 | 2/2013 | Bakker |
| 2013/0093685 A1 | 4/2013 | Kalu et al. |
| 2014/0007705 A1 | 1/2014 | Campbell et al. |
| 2014/0028575 A1 | 1/2014 | Parivar et al. |
| 2014/0055407 A1 | 2/2014 | Lee et al. |

FOREIGN PATENT DOCUMENTS

| | | |
|---|---|---|
| WO | 2004113859 | 12/2004 |
| WO | 2007/139695 | 12/2007 |

OTHER PUBLICATIONS

International Search Report and Written Opinion, dated Nov. 4, 2013, in corresponding International Application No. PCT/US2013/047090.

International Preliminary Report on Patentability dated Dec. 31, 2014 in corresponding International Application No. PCT/US2013/047090.

Mei et al., "Design and fabrication of an integrated three-dimensional tactile sensor for space robotic applications," Micro Electro Mechanical Systems, 1999. MEMS '99 Twelfth IEEE International Conference in Orlando, FL, USA, pp. 112-117 (1999).

\* cited by examiner

WAFER LEVEL MEMS FORCE DIES

CROSS-REFERENCE TO RELATED APPLICATION

This application claims the benefit of U.S. Provisional Patent Application No. 61/690,161, filed on Jun. 21, 2012, entitled "RUGEDIZED MEMS FORCE DIE," the disclosure of which is expressly incorporated herein by reference in its entirety.

FIELD

This disclosure describes a microelectromechanical (MEMS) device and, more specifically, a MEMS device for measuring an applied force and producing an output signal.

BACKGROUND

Current force sensors, joysticks, and touch-controls for OEM applications are based on aging technologies such as mechanical buttons, force sensitive resistors, and resistive ink. The purpose of the present disclosure is to provide high tech wafer level MEMS force dies, which are highly sensitive, compact, mass producible, and cost effective.

SUMMARY

Described herein are composite wafer level MEMS force dies including of a spacer coupled to a sensor. The sensor includes at least one flexible sensing element, such as a beam or diaphragm, having one or more sensor elements formed thereon. Each of the sensor elements can have at least one variable electrical characteristic (e.g., resistance, capacitance, charge, etc.) based on an amount or magnitude of applied force. Optionally, the variable electrical characteristic can change in proportion to the amount or magnitude of the applied force. By measuring the variable electrical characteristic, it is possible to determine the amount or magnitude of the applied force. Optionally, the sensors elements can be piezoresistive, piezoelectric or capacitive elements, for example. One or more wire bonding pads connected to the sensor elements are placed on the outer periphery of the sensor.

The spacer, which protects the flexible sensing elements and the wire bonds and/or wire bonding pads, is bonded to the sensor. For the beam version, the bond is implemented at the outer edges of the die. For the diaphragm version, the bond is implemented in the center of the die. An interior gap between the spacer and the sensor allows the flexible sensing element to deflect. The gap can also be used to limit the amount of deflection of the flexible sensing element in order to provide overload protection.

The configuration of the composite MEMS force dies described herein facilitate applying force directly to the die and coupling it via the spacer to the flexible sensing element. The flexible sensing element is configured to deflect and stress the sensor elements, which change at least one electrical characteristic based on an amount or magnitude of the applied force, and optionally, provide an output signal proportional to the amount or magnitude of the applied force.

An example MEMS force die can include a spacer for receiving an applied force and a sensor bonded to the spacer. The sensor can include at least one flexible sensing element having one or more sensor elements formed thereon. The flexible sensing element can be configured to deflect in response to the applied force received by the spacer and transferred to the sensor, and the sensor elements can change at least one electrical characteristic based on an amount or magnitude of the applied force. In addition, at least one of the spacer and the sensor can define a gap, and the gap can be arranged between the spacer and the sensor. A depth of the gap can be configured to limit an amount of deflection of the flexible sensing element.

In some implementations, the sensor can further include a plurality of flexible sensing elements, each of the flexible sensing elements being supported by a support structure. For example, the sensor can define an upper side and a bottom side. The bottom side of the sensor can be etched to form the flexible sensing elements and the support structure, and at least one of the flexible sensing elements can have the sensor elements formed thereon. Additionally, the upper side of the sensor can optionally be etched to form the gap. Alternatively or additionally, the spacer can optionally be etched to form the gap.

In some implementations, the flexible sensing element can be a diaphragm. For example, the sensor can define an upper side and a bottom side. The bottom side of the sensor can be etched to form the diaphragm. Additionally, the upper side of the sensor can optionally be etched to form the gap. Alternatively or additionally, the spacer can optionally be etched to form the gap.

Optionally, the sensor wafer can further define at least one linking area on the upper side of the sensor. The applied force can be transferred to the flexible sensing element via the linking area.

Additionally, the sensor can optionally further include at least one wire bonding pad provided on the upper side of the sensor. Alternatively or additionally, the spacer can have one or more apertures for providing access to the wire bonding pad.

Optionally, the spacer can be configured to prevent damage to the flexible sensing element and shield the wire bonding pad from the applied force.

Optionally, the sensor can be bonded to the spacer using at least one of an anodic bonding, glass frit, thermo-compression and eutectic bonding techniques.

Optionally, the sensor elements are piezoresistive strain gauges. Optionally, the piezoresistive strain gauges can be diffused, deposited or implanted on the flexible sensing element.

An example method for manufacturing a MEMS force die can include etching a sensor wafer to form at least one flexible sensing element, etching at least one of the sensor wafer and a spacer wafer to form at least one gap, forming one or more sensor elements on the flexible sensing element, bonding at least a portion of the sensor wafer and at least a portion of the spacer wafer to form a bonded area and dicing the bonded sensor and spacer wafers along one or more lines intersecting the bonded area. The gap can be arranged between the bonded sensor and spacer wafers. Additionally, the flexible sensing element can be configured to deflect in response to an applied force received by the diced spacer wafer and transferred to the diced sensor wafer, and the sensor elements can change at least one electrical characteristic based on an amount or magnitude of the applied force. A depth of the gap can be configured to limit an amount of deflection of the flexible sensing element.

In some implementations, the sensor wafer can define an upper side and a bottom side. The upper side of the sensor wafer can be etched to form the gap, and the bottom side of the sensor wafer can be etched to form the flexible sensing element. Additionally, the flexible sensing element can optionally be a diaphragm. Alternatively or additionally, the dicing can form a plurality of flexible sensing elements from the diaphragm.

In some implementations, the sensor wafer can define an upper side and a bottom side. The bottom side of the sensor wafer can be etched to form the flexible sensing element, and the spacer wafer can be etched to form the gap. Additionally, the flexible sensing element can optionally be a diaphragm. Alternatively or additionally, the dicing can form a plurality of flexible sensing elements from the diaphragm.

Optionally, the sensor can further define at least one linking area on the upper side of the sensor wafer. The applied force can be transferred to the flexible sensing element via the linking area.

Additionally, the method can further include forming at least one wire bonding pad on the upper side of the sensor wafer. Alternatively or additionally, the spacer wafer can have one or more apertures for providing access to the wire bonding pad.

Optionally, the spacer wafer can be configured to prevent damage to the flexible sensing element and shield the wire bonding pad from the applied force.

Optionally, the sensor wafer can be bonded to the spacer wafer using at least one of an anodic bonding, glass frit, thermo-compression and eutectic bonding techniques.

Optionally, the sensor elements are piezoresistive strain gauges. Optionally, the piezoresistive strain gauges can be diffused, deposited or implanted on the flexible sensing element.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

DETAILED DESCRIPTION

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. While implementations will be described with respect to a composite wafer level MEMS force die, it will become evident to those skilled in the art that the implementations are not limited thereto.

Figure 1:
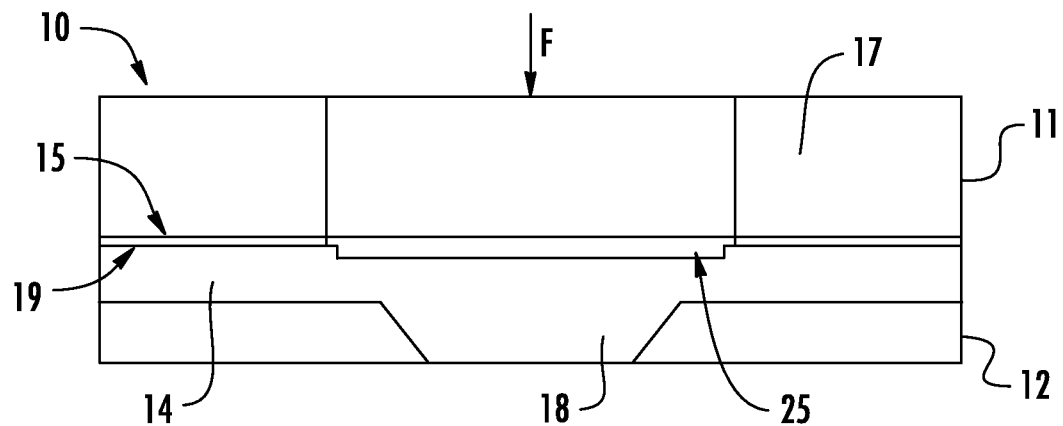
FIG. 1 shows a side view of one implementation of a beam version force die.
Figure 2:
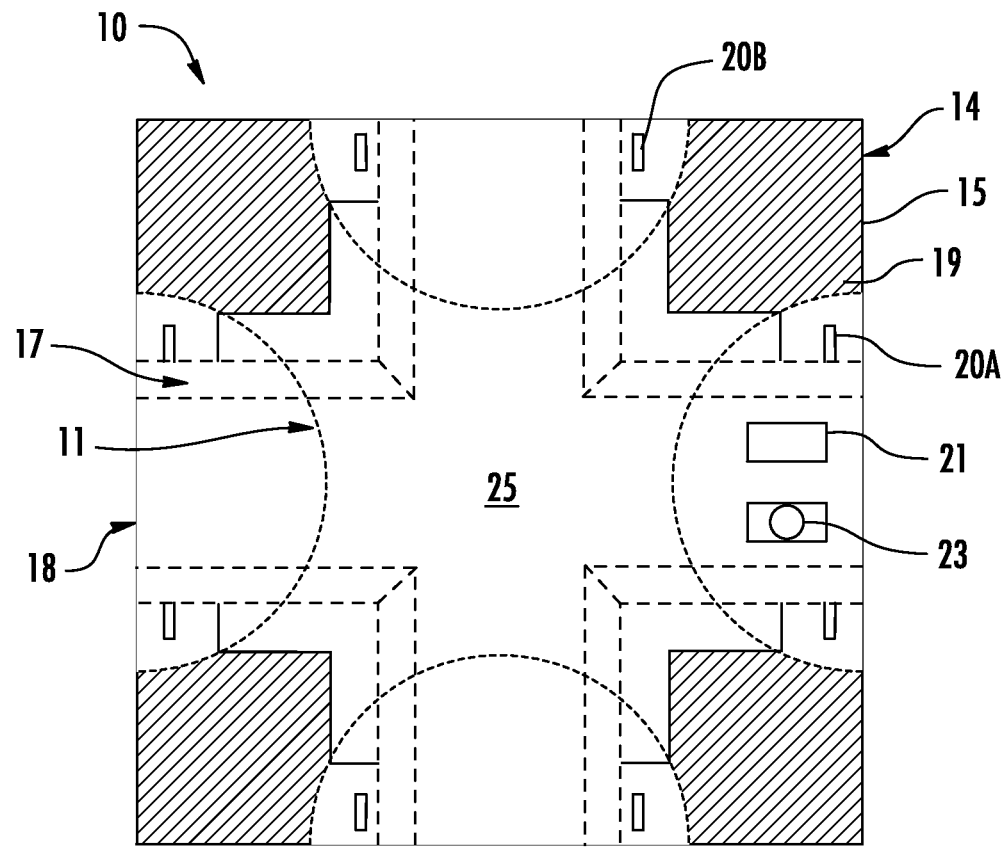
FIG. 2 shows a top view of one implementation of a beam version force die.

Referring to FIGS. 1 and 2, the side view and top view of sensing die 10 are shown, respectively. The die includes spacer 11 and sensor 12. The spacer 11 can optionally be a borosilicate glass spacer, such as a Pyrex spacer. The sensor 12 can optionally be a silicon sensor. It should be understood that this disclosure contemplates that the spacer and/or the sensor can be made from materials other than borosilicate glass and silicon, respectively. The sensor 12 can define an upper side and a bottom side, the bottom side being on an opposing surface of the sensor 12 relative to the upper side. The bottom side of sensor 12 is etched to a predetermined depth to form one or more flexible sensing elements 14. For example, as shown in FIGS. 1 and 2, the bottom side of sensor 12 is etched to form four flexible sensing elements 14, which are supported by cross-shaped structure 18 (e.g., a support structure or beam). The upper side of sensor 12 is etched to a predetermined depth in order to form gap 25. This disclosure contemplates that the predetermined depth of etching the upper side and the bottom side of sensor 12 can be the same or different depths. Spacer 11 has a plurality of apertures 17 and is attached at the corners of sensor 12 to one or more linking areas 15 of flexible sensing elements 14. The linking areas 15 are arranged on the outer edges of sensor 12, for example, on the upper side of sensor 12. Optionally, as shown in FIGS. 1 and 2, spacer 11 has four semi-circular apertures, which are provided only as examples. This disclosure contemplates that the number and/or shape of the apertures 17 are not limited to the examples and that spacer 11 can have more or less and/or different shaped apertures than as shown in FIGS. 1 and 2. Additionally, spacer 11 can optionally be attached to sensor 12 by anodic bonding, for example. When spacer 11 and sensor 12 are attached, gap 25 is arranged between the bonded spacer 11 and sensor 12. The anodic bonded areas 19 are shown in FIG. 1. This disclosure contemplates that other bonding techniques can be used to attach spacer 11 and sensor 12. Other bonding techniques include, but are not limited to, anodic bonding, glass frit, thermo-compression and eutectic bonding techniques.

As shown in FIGS. 1 and 2, the geometry of gap 25 in combination with apertures 17 forms four raised linking areas 15 at the corners of the sensor 12. One or more sensor elements can be formed on at least one of the flexible sensing elements 14. Each of the sensor elements can have at least one variable electrical characteristic (e.g., resistance, capacitance, charge, etc.) based on an amount or magnitude of applied force. Optionally, the variable electrical characteristic can change in proportion to the amount or magnitude of the applied force. For example, when an applied force causes the flexible sensing elements 14 to deflect, the sensing elements are stressed and/or strained, and therefore, the variable electrical characteristic changes. By measuring the variable electrical characteristic, it is possible to determine the amount or magnitude of the applied force. Optionally, the sensors elements can be piezoresistive, piezoelectric or capacitive elements. For example, in FIGS. 1 and 2, piezoresistive strain gauges 20A and 20B are diffused, deposited, or implanted into at least one of flexible sensing elements 14 to form an open or closed Wheatstone bridge. One or more wire bonding pads 21 are placed on cross-shaped structure 18 on at least one side of sensing die 10, for example, on the upper side of the sensor 12. Wire bonds 23 can be attached at the wire bonding pads 21. Apertures 17 of spacer 11 provide access to wire bonding pads 21. Spacer 11 protects flexible sensing elements 14 and shields wire bonding pads 21 and/or wire bonds 23 from the force applied on spacer 11. Optionally, spacer 11 has a thickness that is adequate to protect wire bonds 23 (e.g., the ball bond and the loop of the wire bond) and also support the applied force. Force "F" is transferred via linking areas 15 on the upper side of sensor 12 to flexible sensing elements 14. Gap 25 allows flexible sensing elements 14 to deflect and to stress strain gauges 20A and 20B, which optionally provide an output signal proportional to an amount or magnitude of the applied force. For example, when the flexible sensing elements 14 deflect and stress strain gauges 20A and 20B, the strain gauges change resistance (e.g., an electrical characteristic) based on an amount or magnitude of the applied force, and optionally, provide an output signal proportional to the amount or magnitude of the applied force. The depth of gap 25 is selected or configured to limit the amount of deflection of the flexible sensing elements 14 in order to provide overload protection.

Figure 3:
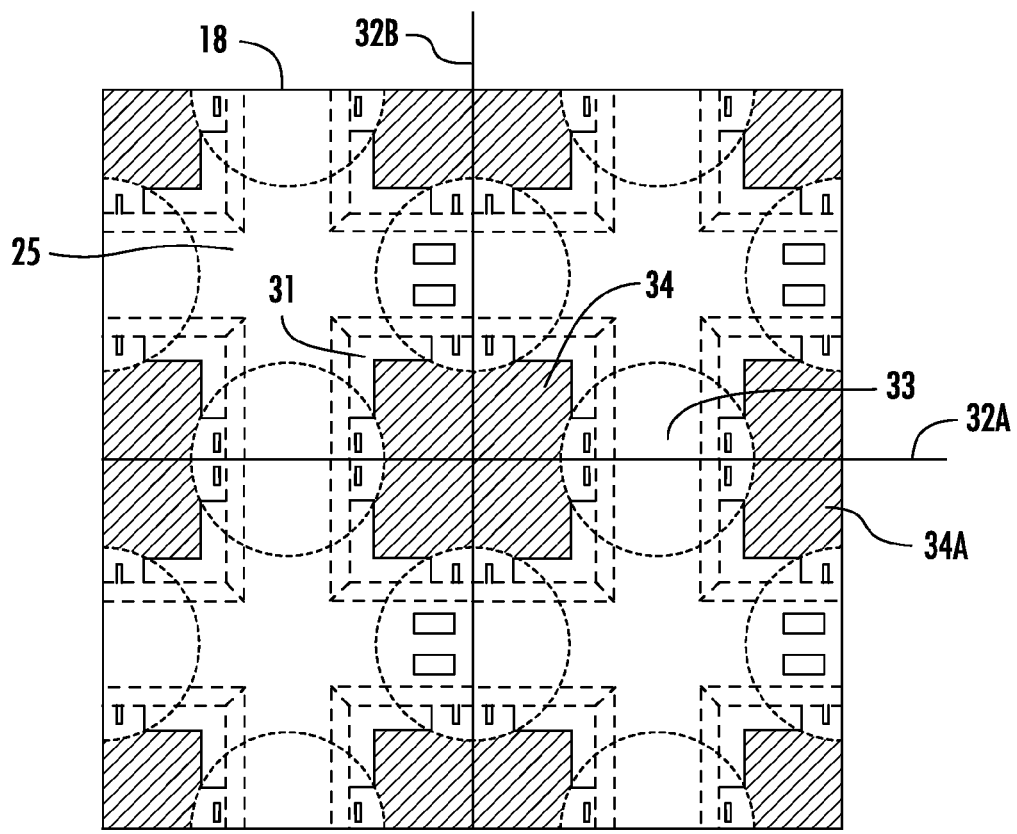
FIG. 3 shows a top view of a section of the wafer of one implementation of a beam version force die.

Referring to FIG. 3, the top view of a section of the composite wafer, which is comprised of a sensor wafer bonded to a spacer wafer, is shown. Optionally, the sensor wafer and the spacer wafer can be the composite wafer from which the sensing die 10 described above with regard to FIGS. 1 and 2 are formed. The bottom side of the sensor wafer is etched to a predetermined depth to form diaphragms 31. The top of the sensor wafer is etched to a predetermined depth to form gaps 25. As discussed above, the predetermined depth of the diaphragm 31 and gaps 25 can be the same or different depths. The spacer wafer has holes 33. In FIG. 3, the holes 33 are round or circular. This disclosure contemplates that the holes 33 can have other shapes. The spacer wafer and the sensor wafer are anodic bonded in areas 34, reinforcing the sensor wafer with the spacer wafer. As discussed above, the spacer and sensor wafers can be attached using other bonding techniques such as glass frit, thermo-compression and eutectic bonding techniques. Optionally, the spacer wafer has a thickness that is adequate to protect the wire bonds (e.g., the ball bond and the loop of the wire bond) and also support the applied force. Alternatively or additionally, a thickness of the spacer wafer is optionally greater than a thickness of the sensor wafer. When the composite wafer is diced along lines 32A and 32B, the saw cuts through ruggedized areas, which prevents damage to the thin sensor wafer sections. In other words, the composite wafer is diced along portions where the sensor wafer, and in particular the flexible sensing elements (e.g., diaphragms 31) of the sensor wafer, is reinforced by the spacer wafer. Areas 34 are diced into four areas 34A, which become the four corners of the die 10. The four areas 34A can correspond to flexible sensing elements 14 (with linking areas 15) of the sensing die 10 as shown in FIGS. 1 and 2, for example. By being held in four corners, the die can better resist bending and torsion moments produced by the saw, which protects the dies during the dicing.

Figure 4:
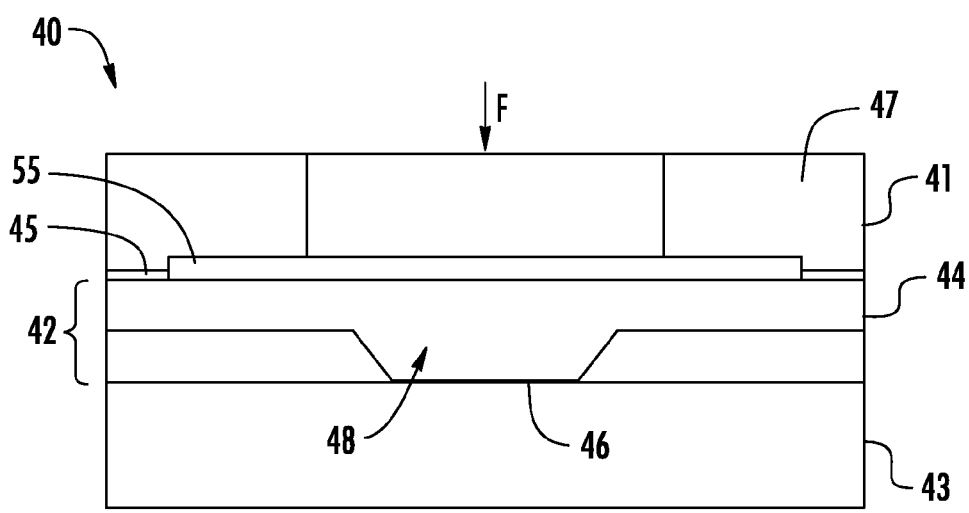
FIG. 4 shows a side view of another implementation of a beam version force die including a cap.
Figure 5:
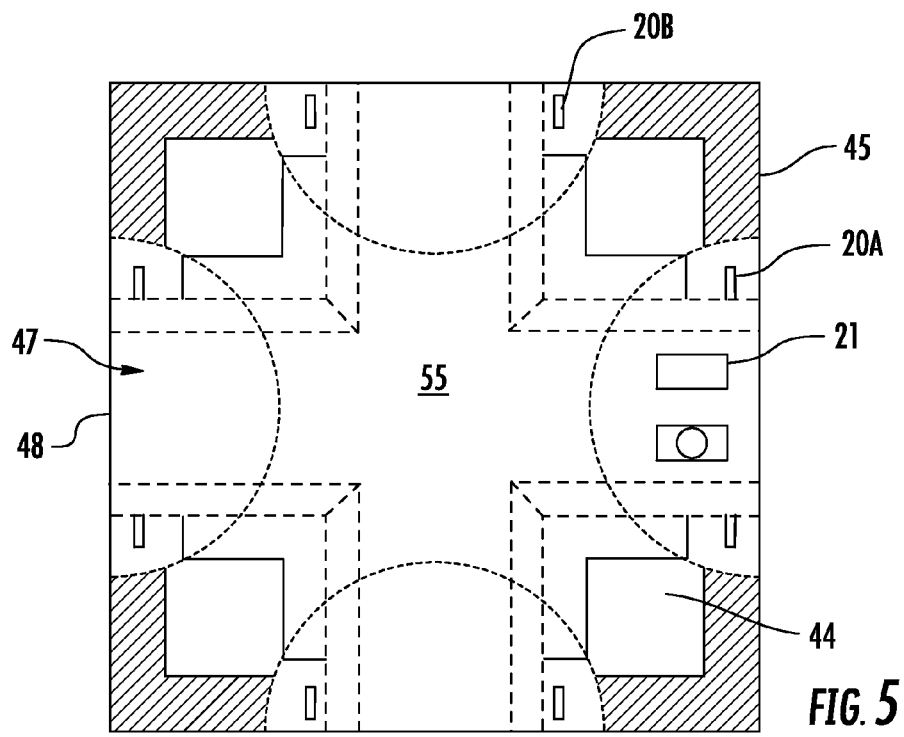
FIG. 5 shows a top view of another implementation of a beam version force die including a cap.

Referring to FIGS. 4 and 5, the side view and top view of sensing die 40 are shown, respectively. The die includes cap shaped spacer 41 and sensor 42. The spacer 41 can optionally be a borosilicate glass spacer, such as a Pyrex spacer. The sensor 42 can optionally be a silicon sensor. It should be understood that this disclosure contemplates that the spacer and/or the sensor can be made from materials other than borosilicate glass and silicon, respectively. Optionally, the sensing die 40 can be bonded to a pedestal 43, for example, by bonding cross-shaped structure 48 of sensor 42 to the pedestal 43 with bond 46. The sensing die 40 can be bonded to the pedestal 43 using anodic bonding, glass frit, thermo-compression bonding, eutectic bonding techniques or any other suitable bonding technique. Optionally, the pedestal 43 can be a borosilicate glass pedestal, such as Pyrex glass pedestal. The sensor 42 can define an upper side and a bottom side, the bottom side being on an opposing surface of the sensor 42 relative to the upper side. The bottom side of sensor 42 is etched to a predetermined depth to form a plurality of flexible sensing elements 44 (e.g., four flexible sensing elements 44 as shown in FIGS. 4 and 5), which are supported by cross-shaped structure 48. Spacer 41 has a plurality of apertures 47 and gap 55. The spacer 41 can define an upper side and a bottom side, the bottom side being on an opposing surface of the spacer 41 relative to the upper side. The spacer 41 can be etched or machined by micro-abrasive machining, for example, or other suitable technique to provide gap 55 of a predetermined depth in the bottom side of spacer 41. This disclosure contemplates that the predetermined depth of etching the bottom side of sensor 42 and the predetermined depth of the gap 55 formed in spacer 41 can be the same or different depths. As shown in FIGS. 4 and 5, the spacer 41 has four semi-circular apertures, which are provided only as examples. This disclosure contemplates that the number and/or shape of the apertures 47 are not limited to the examples and that the spacer 41 can have more or less and/or different shaped apertures than as shown in FIGS. 4 and 5. Spacer 41 is attached to sensor 42 by bonding to the linking areas 45 of flexible sensing elements 44. When spacer 41 and sensor 42 are bonded together, gap 55 is arranged between the bonded spacer 41 and sensor 42. It should be understood that the linking areas 45 are the areas where the spacer 41 and sensor 42 are bonded together. As shown in FIGS. 4 and 5, the linking areas 45 are arranged at the outer edges of the flexible sensing elements 44, for example, on the upper side of sensor 42. Additionally, spacer 41 and sensor 42 can be bonded using anodic bonding, glass frit, thermo-compression bonding, eutectic bonding techniques or any other suitable bonding technique.

As shown in FIGS. 4 and 5, apertures 47 of cap shaped spacer 41 provide access to one or more wire bonding pads 21 provided on the upper side of sensor 42. In addition, one or more sensor elements can be formed on at least one of the flexible sensing elements 44. Similar to above, each of the sensor elements can have at least one variable electrical characteristic (e.g., resistance, capacitance, charge, etc.) based on an amount or magnitude of applied force. Optionally, the sensors elements can be piezoresistive, piezoelectric or capacitive elements. For example, in FIGS. 4 and 5, piezoresistive strain gauges 20A and 20B are diffused, deposited, or implanted into at least one of flexible sensing elements 44 to form an open or closed Wheatstone bridge. Spacer 41 protects flexible sensing elements 44 and shields wire bonding pads 21 and/or wire bonds from the force applied on spacer 41. Optionally, spacer 41 has a thickness that is adequate to protect the wire bonds (e.g., the ball bond and the loop of the wire bond) and also support the applied force. Force "F", applied to spacer 41, is linked via linking areas 45 at the outer edges of flexible sensing elements 44. Similar to above, the applied force deflects flexible sensing elements 44 and stresses strain gauges 20A and 20B, which changes the resistance of the strain gauges based on an amount or magnitude of the applied force, and optionally, provides an output signal proportional to the amount or magnitude of the applied force. The depth of gap 48 can be selected or configured to limit the amount of deflection of the flexible sensing elements 44 in order to provide overload protection.

Figure 6:
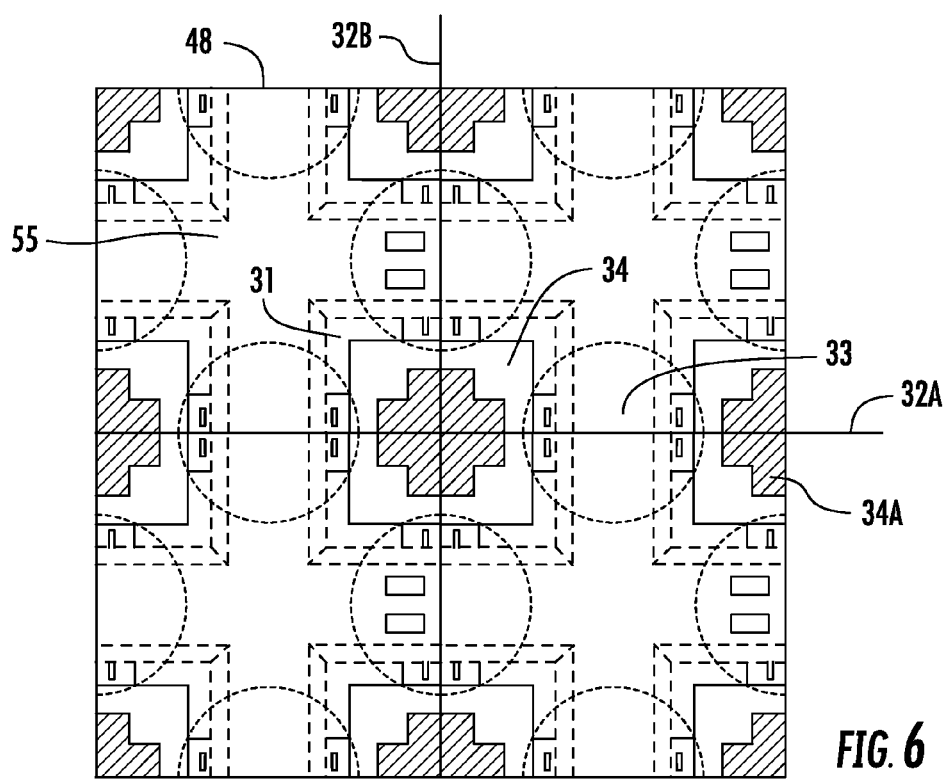
FIG. 6 shows a top view of a section of the wafer of another implementation of a beam version force die including a cap.

Referring to FIG. 6, the top view of a section of the composite wafer, which is comprised of a sensor wafer bonded to a spacer wafer, is shown. Optionally, the sensor wafer and the spacer wafer can be the composite wafer from which the sensing die 40 described above with regard to FIGS. 4 and 5 are formed. The bottom side of the sensor wafer is etched to a predetermined depth to form diaphragms 31. The spacer wafer can be etched or machined by micro-abrasive machining, for example, or other suitable technique to provide gaps 55 of a predetermined depth. As discussed above, the predetermined depth of the diaphragm 31 and gaps 55 can be the same or different depths. The spacer wafer has holes 33. In FIG. 6, the holes 33 are round or circular. This disclosure contemplates that the holes 33 can have other shapes. The spacer wafer and the sensor wafer are anodic bonded in areas 34, reinforcing the sensor wafer with the spacer wafer. As discussed above, the spacer and sensor wafers can be attached using other bonding techniques such as glass frit, thermo-compression and eutectic bonding techniques. Optionally, the spacer wafer has a thickness that is adequate to protect the wire bonds (e.g., the ball bond and the loop of the wire bond) and also support the applied force. Alternatively or additionally, a thickness of the spacer wafer is optionally greater than a thickness of the sensor wafer. When the composite wafer is diced along lines 32A and 32B, the saw cuts through ruggedized areas, which prevents damage to the thin sensor wafer sections. In other words, the composite wafer is diced along portions where the sensor wafer, and in particular the flexible sensing elements (e.g., diaphragms 31) of the sensor wafer, is reinforced by the spacer wafer. Areas 34 are diced into four areas 34A, which become the four corners of the die 40. The four areas 34A can correspond to flexible sensing elements 44 (with linking areas 45) of the sensing die 40 as shown in FIGS. 4 and 5, for example. By being held in four corners, the die can better resist bending and torsion moments produced by the saw, which protects the dies during the dicing.

Figure 7:
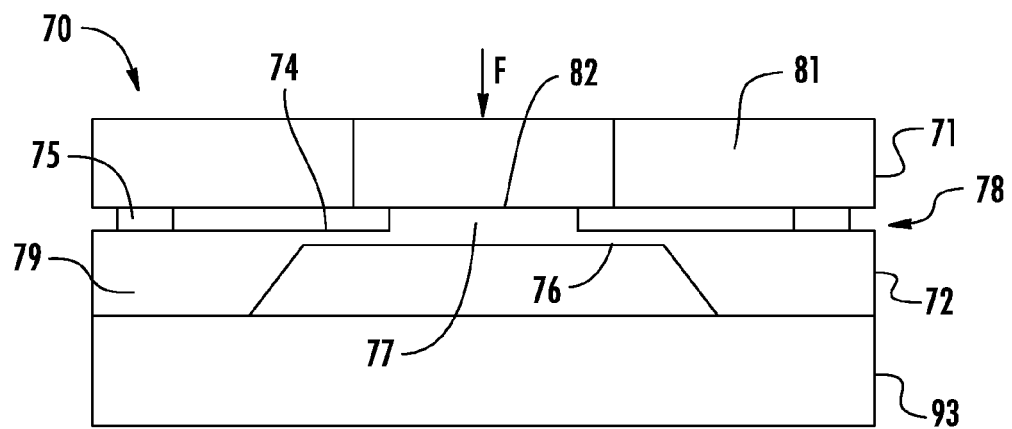
FIG. 7 shows a side view of one implementation of a diaphragm version force die.
Figure 8:
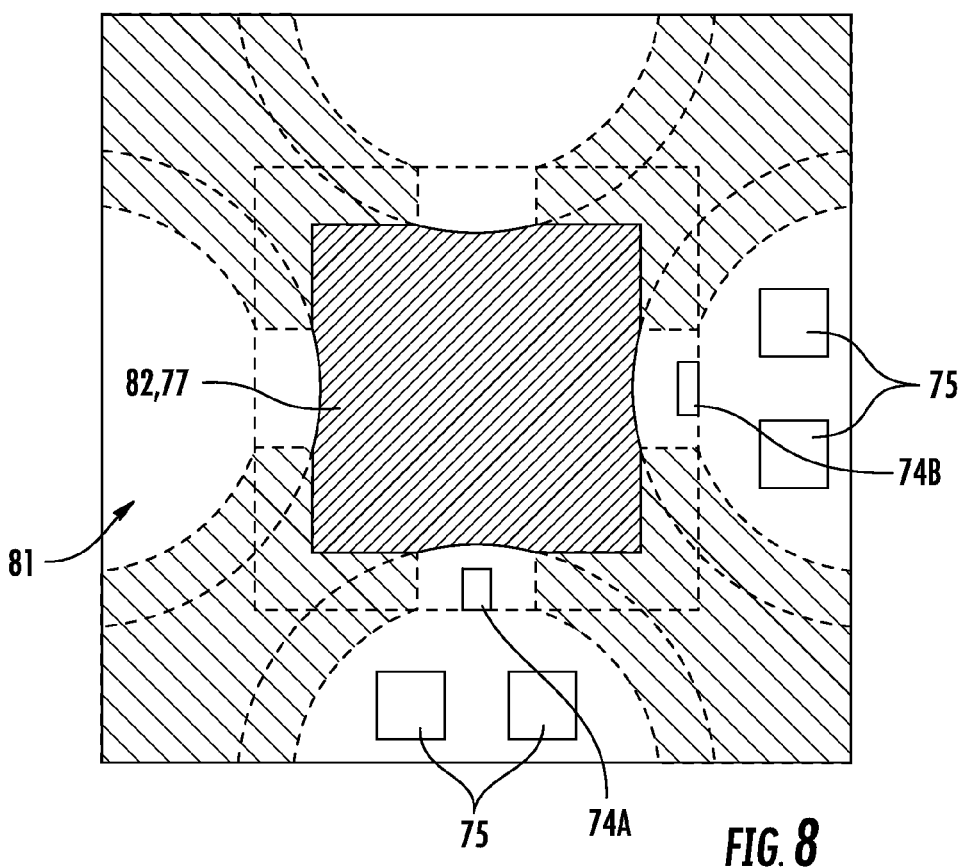
FIG. 8 shows a top view of one implementation of a diaphragm version force die.

Referring to FIGS. 7 and 8, the side view and top view of sensing die 70 are shown, respectively. The die includes spacer 71 and sensor 72. The spacer 71 can optionally be a borosilicate glass spacer, such as a Pyrex spacer. The sensor 72 can optionally be a silicon sensor. It should be understood that this disclosure contemplates that the spacer and/or the sensor can be made from materials other than borosilicate glass and silicon, respectively. Optionally, the sensing die 70 can be bonded to a pedestal 93. The sensing die 70 can be bonded to the pedestal 93 using anodic bonding, glass frit, thermo-compression bonding, eutectic bonding techniques or any other suitable bonding technique. Optionally, the pedestal 93 can be a borosilicate glass pedestal, such as Pyrex glass pedestal. The sensor 72 can define an upper side and a bottom side, the bottom side being on an opposing surface of the sensor 72 relative to the upper side. The bottom of sensor 72 is etched to a predetermined depth in order to form the flexible sensing element 76, which is supported by frame 79. The flexible sensing element can be a diaphragm as shown in FIGS. 7 and 8. The upper side of sensor 72 is etched to a predetermined depth in order to form gap 78 and linking area 77. This disclosure contemplates that the predetermined depth of etching the upper side and the bottom side of the sensor 72 can be the same or different depths. Spacer 71 has a plurality of apertures 81, for example, the four semi-circular apertures 81 shown in FIGS. 7 and 8. Spacer 71 and sensor 72 can be bonded together using anodic bonding, glass frit, thermo-compression bonding, eutectic bonding techniques or any other suitable bonding technique. For example, the central area 82 of spacer 71 is bonded to linking area 77 of sensor 72. The linking area 77 is located in a central area of the sensor 72 as opposed to the outer edges of the sensor as shown in FIGS. 1-2 and 4-5. It should be understood that the linking area 77 is the area where the spacer 71 and sensor 72 are bonded together. When spacer 71 and sensor 72 are bonded together, gap 78 is arranged there between.

As shown in FIGS. 7 and 8, the geometry of gap 78 combined with apertures 81 form a raised linking area 77 at the center of the die. One or more sensor elements can be formed on the flexible sensing element 76. Similar to above, each of the sensor elements can have at least one variable electrical characteristic (e.g., resistance, capacitance, charge, etc.) based on an amount or magnitude of applied force. Optionally, the sensors elements can be piezoresistive, piezoelectric or capacitive elements. For example, in FIGS. 7 and 8, piezoresistive strain gauges 74A and 74B are diffused, deposited, or implanted into flexible sensing element 76 to form an open or closed Wheatstone bridge. One or more wire bonding pads 75 are placed on at least one side of sensing die 70. Apertures 81 provide access to wire bonding pads 75. Spacer 71 shields wire bonding pads 75 and/or wire bonds from the force applied on spacer 71. Optionally, the spacer 71 has a thickness that is adequate to protect the wire bonds (e.g., the ball bond and the loop of the wire bond) and also support the applied force. The applied force "F" is linked via spacer 71 to flexible sensing element 76 through the linking area 77 (e.g., the central bonded area). The flexible sensing element 76 deflects and stresses strain gauges 74A and 74B, which changes the resistance of the strain gauges based on an amount or magnitude of the applied force, and optionally, provides an output signal proportional to the amount or magnitude of the applied force. The depth of gap 78 can be selected or configured to limit the amount of deflection of the flexible sensing element 76 in order to provide overload protection.

Figure 9:
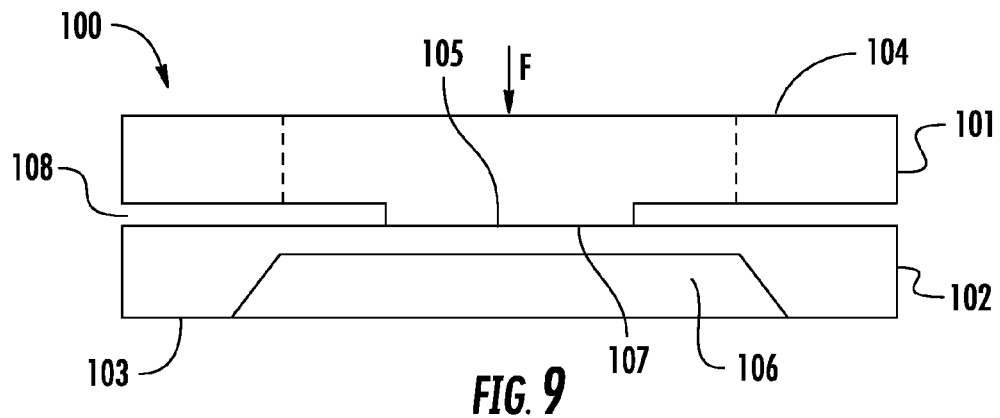
FIG. 9 shows a side view of another implementation of a diaphragm version force die.
Figure 10:
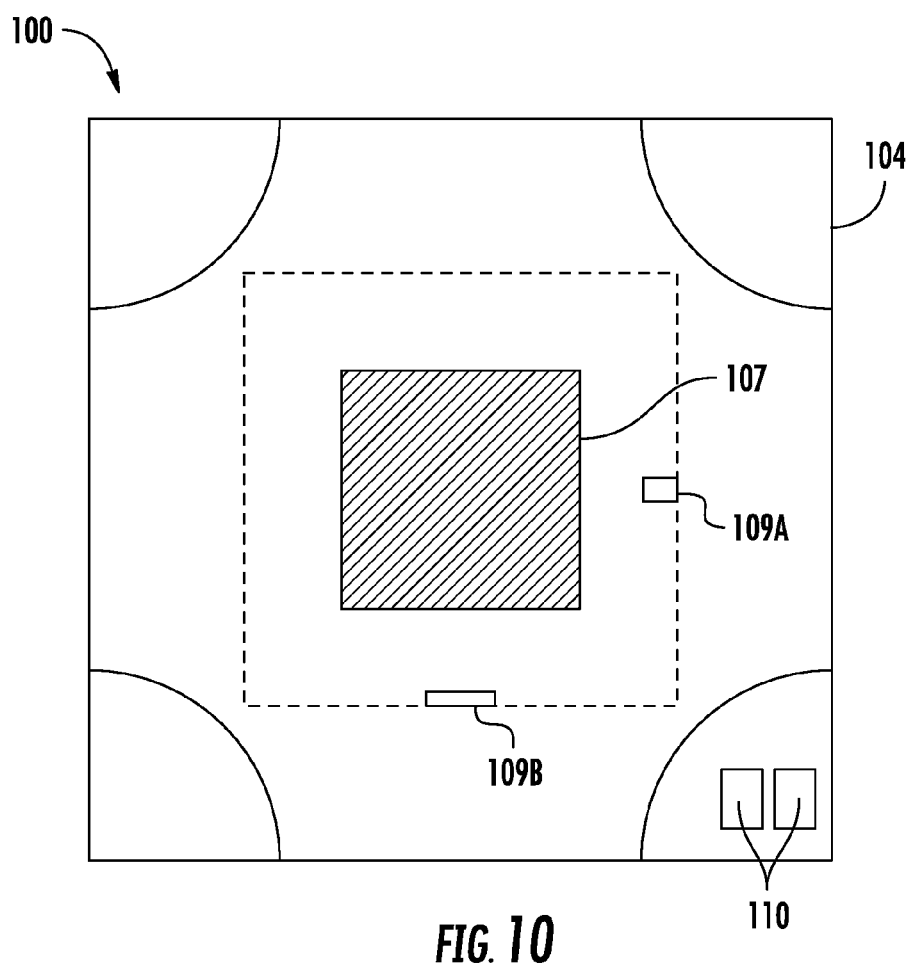
FIG. 10 shows a top view of another implementation of a diaphragm version force die.

Referring to FIGS. 9 and 10, the side view and top view of sensing die 100 are shown, respectively. The die includes spacer 101 and sensor 102. The spacer 101 can optionally be a borosilicate glass spacer, such as a Pyrex spacer. The sensor 102 can optionally be a silicon sensor. It should be understood that this disclosure contemplates that the spacer and/or the sensor can be made from materials other than borosilicate glass and silicon, respectively. The sensor 102 can define an upper side and a bottom side, the bottom side being on an opposing surface of the sensor 102 relative to the upper side. The bottom of sensor 102 is etched to a predetermined depth in order to form flexible sensing element 106, which supported by frame 103. Flexible sensing element 106 can be a diaphragm, for example. The spacer 101 includes a plurality of apertures 104. As shown in FIGS. 9 and 10, spacer 101 includes four quarter-circle apertures 104 in the corners of the spacer 101, for example. This disclosure contemplates that the number and/or shape of the apertures 104 are not limited to the examples and that the spacer 101 can have more or less and/or different shaped apertures than as shown in FIGS. 9 and 10. The spacer 41 can define an upper side and a bottom side, the bottom side being on an opposing surface of the spacer 41 relative to the upper side. Additionally, a center protrusion 105 is etched or machined on the bottom side of spacer 101 to a predetermined depth. This disclosure contemplates that the predetermined depth of etching the bottom side of the sensor 102 and the predetermined depth of etching or machining the spacer 101 can be the same or different depths. Spacer 101 and sensor 102 can be bonded together using anodic bonding, glass frit, thermo-compression bonding, eutectic bonding techniques or any other suitable bonding technique. For example, in FIGS. 9 and 10, the protrusion of spacer 101 is anodic bonded to linking area 107 in a central area of sensor 102. The bond forms gap 108 between spacer 101 and sensor 102.

One or more sensor elements can be formed on the flexible sensing element 106. Similar to above, each of the sensor elements can have at least one variable electrical characteristic (e.g., resistance, capacitance, charge, etc.) based on an amount or magnitude of applied force. Optionally, the sensors elements can be piezoresistive, piezoelectric or capacitive elements. For example, as shown in FIGS. 9 and 10, piezoresistive strain gauges 109A and 109B are diffused, deposited, or implanted into flexible sensing element 106 to form an open or closed Wheatstone bridge. One or more wire bonding pads 110 are placed on frame 103, for example on the upper side of the sensor 102, on at least one side of sensing die 100. Apertures 104 provide access to wire bonding pads 110. Spacer 101 protects flexible sensing element 106 and shields wire bonding pads 110 and/or wire bonds from the force applied on spacer 101. Optionally, the spacer 101 has a thickness that is adequate to protect the wire bonds (e.g., the ball bond and the loop of the wire bond) and also support the applied force. The force "F" applied to spacer 101 is linked via the protrusion 105 and/or linking area 107 to flexible sensing element 106. Flexible sensing element 106 deflects and stresses strain gauges 109A and 109B, which changes the resistance of the strain gauges based on an amount or magnitude of the applied force, and optionally, provides an output signal proportional to the amount or magnitude of the applied force. The depth of gap 108 can be selected or configured to limit the amount of deflection of flexible sensing element 106 in order to provide overload protection.

Figure 11:
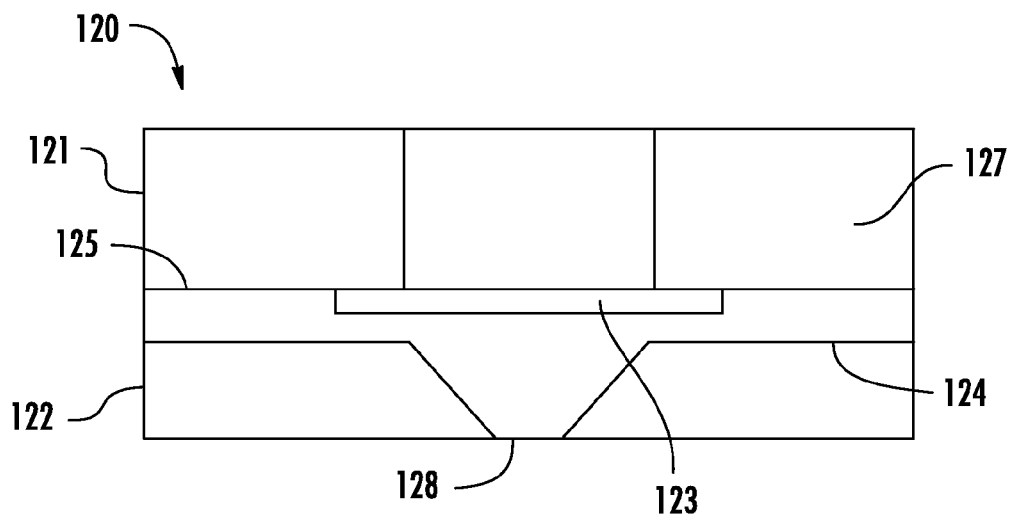
FIG. 11 shows a side view of one implementation of a miniaturized beam version force die.
Figure 12:
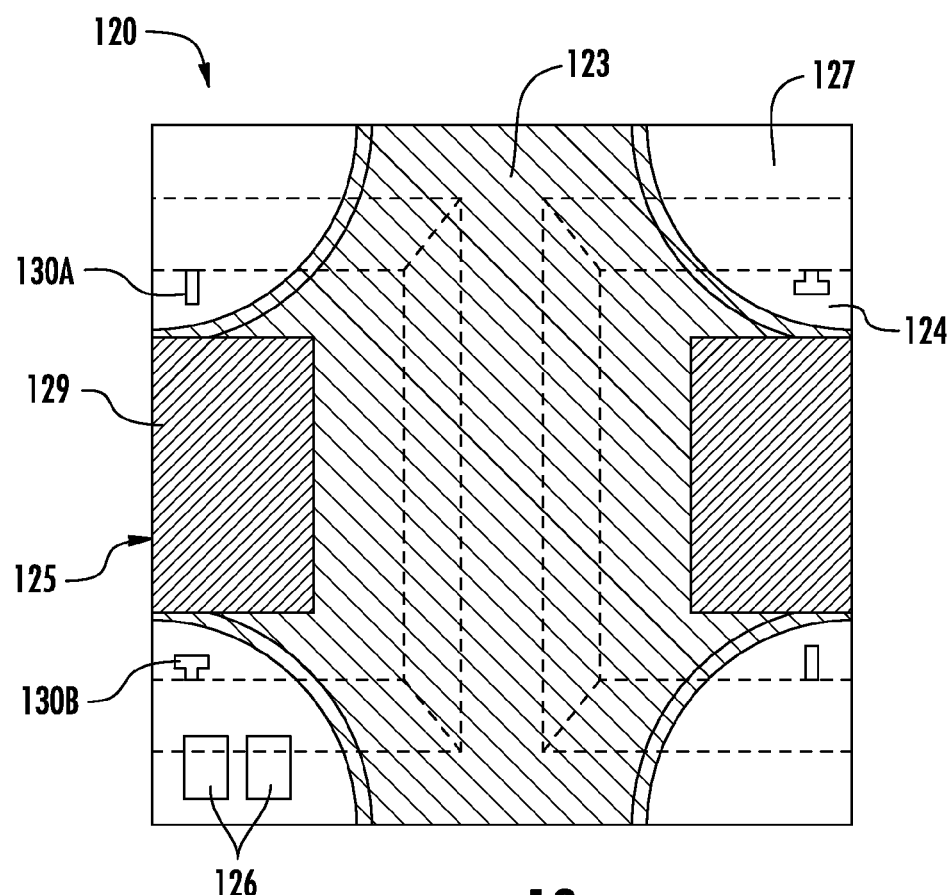
FIG. 12 shows a top view of one implementation of a miniaturized beam version force die.

Referring to FIGS. 11 and 12, the side view and top view of sensing die 120 are shown, respectively. The die is comprised of spacer 121 and sensor 122. The spacer 121 can optionally be a borosilicate glass spacer, such as a Pyrex spacer. The sensor 122 can optionally be a silicon sensor. It should be understood that this disclosure contemplates that the spacer and/or the sensor can be made from materials other than borosilicate glass and silicon, respectively. The sensor 122 can define an upper side and a bottom side, the bottom side being on an opposing surface of the sensor 122 relative to the upper side. The bottom side of sensor 122 is etched to a predetermined depth to form a plurality of flexible sensing elements 124 supported by structure 128. For example, in FIGS. 11 and 12, two flexible sensing elements 124 supported by structure 128 are shown. The upper side of sensor 122 is etched to a predetermined depth in order to form gap 123 and linking areas 125. This disclosure contemplates that the predetermined depth of etching the upper side and the bottom side of the sensor 122 can be the same or different depths. It should be understood that the linking areas 125 are the areas where the spacer 121 and sensor 122 are bonded together. Spacer 121 has a plurality of apertures 127. In FIGS. 11 and 12, spacer 121 has four semi-circular apertures. This disclosure contemplates that the number and/or shape of the apertures 127 are not limited to the examples and that the spacer 121 can have more or less and/or different shaped apertures than as shown in FIGS. 11 and 12. Additionally, spacer 121 and sensor 122 can be bonded together with gap 123 arranged between spacer 121 and sensor 122. The spacer 121 can be optionally attached to the sensor 122 by anodic bonding, for example, in anodic bonded areas 129. This disclosure contemplates that other bonding techniques can be used to attach the spacer 121 and the sensor 122. Other bonding techniques include, but are not limited to, anodic bonding, glass frit, thermo-compression and eutectic bonding techniques.

One or more sensor elements can be formed on the flexible sensing element 124. Similar to above, each of the sensor elements can have at least one variable electrical characteristic (e.g., resistance, capacitance, charge, etc.) based on an amount or magnitude of applied force. Optionally, the sensors elements can be piezoresistive, piezoelectric or capacitive elements. For example, as shown in FIGS. 11 and 12, piezoresistive strain gauges 130A and 130B are diffused, deposited, or implanted on flexible sensing elements 124. One or more wire bonding pads 126 are placed on at least one corner of sensing die 120, for example, on the upper side of the sensor 122. Apertures 127 of spacer 121 provide access to wire bonding pads 126. Spacer 121 protects flexible sensing elements 124 and shields wire bonding pads 126 and/or wire bonds from the force applied on spacer 121. Optionally, the spacer 121 has a thickness that is adequate to protect the wire bonds (e.g., the ball bond and the loop of the wire bond) and also support the applied force. As discussed above, spacer 121 is attached to linking areas 125 of flexible sensing elements 124 in anodic bonding areas 129 (cross hatched in FIG. 12). When a force is applied to spacer 121, flexible sensing beams 124 deflect and stress strain gauges 120A and 120B, which changes the resistance of the strain gauges based on an amount or magnitude of the applied force, and optionally, provides an output signal proportional to the amount or magnitude of the applied force. The depth of gap 123 can be selected or configured to limit the amount of deflection of flexible sensing elements 124 in order to provide overload protection.

Figure 13:
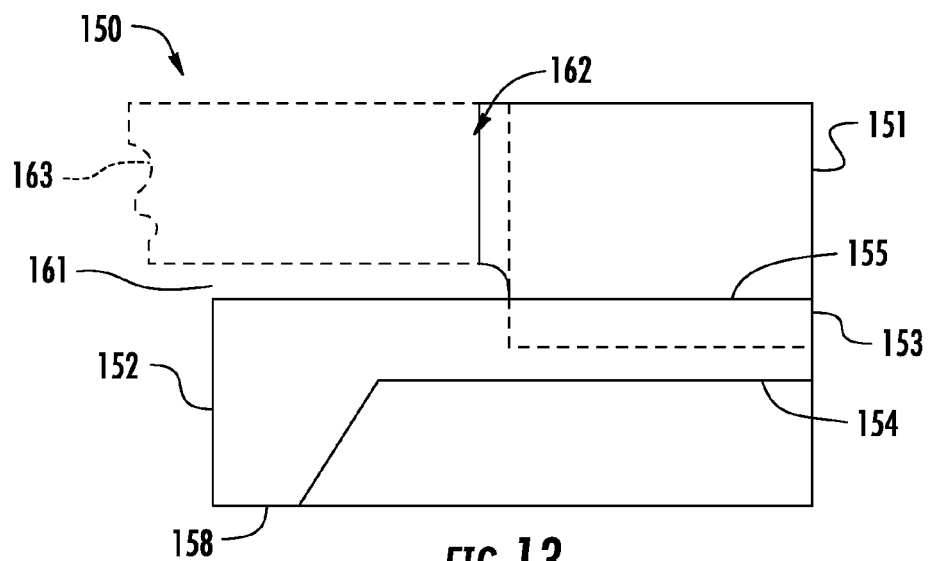
FIG. 13 shows a side view of another implementation of a miniaturized beam version force die.
Figure 14:
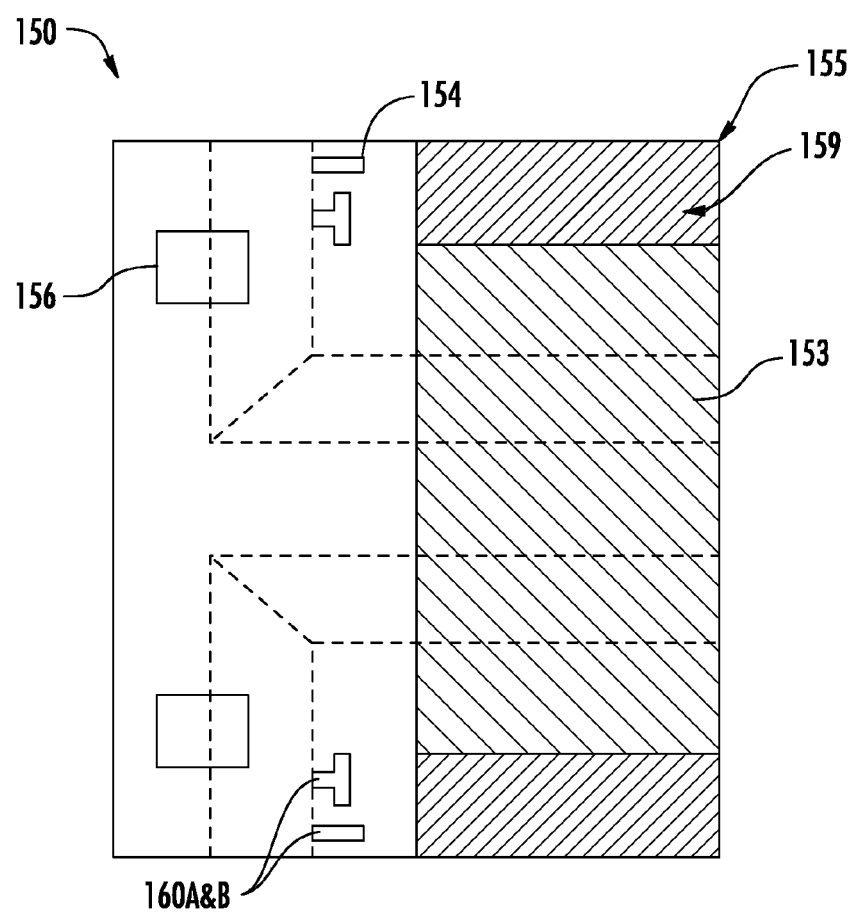
FIG. 14 shows a top view of another implementation of a miniaturized beam version force die.

Referring to FIGS. 13 and 14, the side view and top view of sensing die 150 are shown, respectively. The die includes of spacer 151 and sensor 152. The spacer 151 can optionally be a borosilicate glass spacer, such as a Pyrex spacer. The sensor 152 can optionally be a silicon sensor. It should be understood that this disclosure contemplates that the spacer and/or the sensor can be made from materials other than borosilicate glass and silicon, respectively. The sensor 152 can define an upper side and a bottom side, the bottom side being on an opposing surface of the sensor 152 relative to the upper side. The bottom side of sensor 152 is etched to a predetermined depth to form at least one flexible sensing element 154, which is supported by structure 158. The upper side of sensor 152 is etched to a predetermined depth in order to form gap 153 and linking areas 155. This disclosure contemplates that the predetermined depth of etching the upper side and the bottom side of the sensor 152 can be the same or different depths. It should be understood that the linking areas 155 are the areas where the spacer 151 and sensor 152 are bonded together. Spacer 151 and sensor 152 can be attached, for example, using anodic bonding, glass frit, thermo-compression, eutectic bonding or other suitable bonding techniques. Gap 153 can be arranged between spacer 151 and sensor 152 when bonded together. Spacer 151 includes a recess 161, etched or machined by micro abrasive machining or a similar process. In addition to conventional dicing of the bonded spacer and sensor wafers, the spacer wafer only can also be diced along line 162 down to recess 161, which facilitates removal of section 163 of spacer 151 to expose one or more wire bonding pads 156.

One or more sensor elements can be formed on the flexible sensing element 154. Similar to above, each of the sensor elements can have at least one variable electrical characteristic (e.g., resistance, capacitance, charge, etc.) based on an amount or magnitude of applied force. Optionally, the sensors elements can be piezoresistive, piezoelectric or capacitive elements. For example, as shown in FIGS. 13 and 14, piezoresistive strain gauges 160A and 160B are diffused, deposited, or implanted on flexible sensing element 154. Wire bonding pads 156 are placed on structure 158, for example, on the upper side of sensor 152. Spacer 151 is attached to linking areas 155 by anodic bonded areas 159 (cross hatched in FIG. 14). When a force is applied to spacer 151, flexible sensing element 154 (e.g., flexible sensing beam) deflects and stresses strain gauges 160A and 160B, which changes the resistance of the strain gauges based on an amount or magnitude of the applied force, and optionally, provides an output signal proportional to the amount or magnitude of the applied force. The depth of gap 153 (hatched in FIG. 14) can be selected or configured to limit the amount of deflection of flexible sensing element 154 in order to provide overload protection.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A MEMS force die, comprising:
   a spacer for receiving an applied force; and
   a sensor having a center and an outer edge, wherein the sensor is bonded to the spacer at a plurality of linking areas along at least a portion of the outer edge, the sensor comprising at least one flexible sensing element having one or more sensor elements formed on an upper surface of the at least one flexible sensing element, the at least one flexible sensing element having a thickness less than a thickness at the center of the sensor, the at least one flexible sensing element being configured to deflect in response to the applied force received by the spacer and transferred to the sensor, and the one or more sensor elements changing at least one electrical characteristic based on an amount of the applied force,
   wherein at least one of the spacer or the sensor defines a gap, the gap being arranged between the spacer and the sensor, the gap extending over the center of the sensor, the plurality of linking areas being arranged to at least partially surround the gap, and a depth of the gap being configured to limit an amount of deflection of the at least one flexible sensing element,
   wherein the spacer is above the at least one flexible sensing element in a thickness direction, and
   wherein the plurality of linking areas are arranged over the at least one flexible sensing element.

2. The MEMS force die of claim 1, wherein the sensor further comprises a plurality of flexible sensing elements, each of the flexible sensing elements being supported by a support structure.

3. The MEMS force die of claim 2, wherein the sensor defines an upper side and a bottom side, the bottom side of the sensor being etched to form the flexible sensing elements and the support structure, and at least one of the flexible sensing elements having the one or more sensor elements formed thereon.

4. The MEMS force die of claim 3, wherein the upper side of the sensor is etched to form the gap.

5. The MEMS force die of claim 3, wherein the spacer is etched to form the gap.

6. The MEMS force die of claim 1, wherein the at least one flexible sensing element comprises a diaphragm.

7. The MEMS force die of claim 6, wherein the sensor defines an upper side and a bottom side, the bottom side of the sensor being etched to form the diaphragm.

8. The MEMS force die of claim 7, wherein the upper side of the sensor is etched to form the gap.

9. The MEMS force die of claim 7, wherein the spacer is etched to form the gap.

10. The MEMS force die of claim 3, wherein the linking areas are arranged on the upper side of the sensor, the applied force being transferred to the at least one of the flexible sensing elements via at least one of the linking areas.

11. The MEMS force die of claim 1, wherein the sensor further comprises at least one wire bonding pad provided on the upper side of the sensor.

12. The MEMS force die of claim 11, wherein the spacer has one or more apertures for providing access to the at least one wire bonding pad.

13. The MEMS force die of claim 11, wherein the spacer is configured to prevent damage to the at least one flexible sensing element and shield the at least one wire bonding pad from the applied force.

14. The MEMS force die of claim 1, wherein the sensor is bonded to the spacer using at least one of an anodic bonding, glass fit, thermo-compression and eutectic bonding techniques.

15. The MEMS force die of claim 1, wherein the one or more sensor elements are piezoresistive strain gauges.

16. A method for manufacturing a MEMS force die, comprising:
   etching a sensor wafer to form at least one flexible sensing element;
   etching at least one of the sensor wafer or a spacer wafer to form a gap;
   forming one or more sensor elements on the at least one flexible sensing element;
   bonding at least a portion of the sensor wafer and at least a portion of the spacer wafer to form a plurality of bonded areas, wherein the gap is arranged between the bonded sensor and spacer wafers; and
   dicing the bonded sensor and spacer wafers along one or more lines intersecting the bonded area, wherein the at least one flexible sensing element is configured to deflect in response to an applied force received by the diced spacer wafer and transferred to the diced sensor wafer, the diced sensor wafer having a center and an outer edge, the gap extending over the center of the diced sensor wafer, the plurality of bonded areas being arranged to at least partially surround the gap along at least a portion of the outer edge of the diced sensor wafer, the one or more sensor elements changing at least one electrical characteristic based on an amount of the applied force, a depth of the gap being configured to limit an amount of deflection of the at least one flexible sensing element, and the at least one flexible sensing element having a thickness less than a thickness at the center of the diced sensor wafer, wherein the diced spacer wafer is above the at least one flexible sensing element in a thickness direction, wherein the one or more sensor elements are arranged on an upper surface of the at least one flexible sensing element, and wherein the plurality of bonded areas are arranged over the at least one flexible sensing element.

17. The method of claim 16, wherein the sensor wafer defines an upper side and a bottom side, the upper side of the sensor wafer being etched to form the gap and the bottom side of the sensor wafer being etched to form the at least one flexible sensing element.

18. The method of claim 16, wherein the sensor wafer defines an upper side and a bottom side, the bottom side of the sensor wafer being etched to form the at least one flexible sensing element, and the spacer wafer being etched to form the gap.

19. The method of claim 16, further comprising forming at least one wire bonding pad on the sensor wafer.

20. The method of claim 19, wherein the spacer wafer has one or more apertures for providing access to the at least one wire bonding pad.

* * * * *